United States Patent
Opris et al.

[19]

[11] Patent Number: 5,889,486

[45] Date of Patent: Mar. 30, 1999

[54] SPLIT CAPACITOR ARRAY FOR DIGITAL-TO-ANALOG SIGNAL CONVERSION

[75] Inventors: Ion E. Opris, Sunnyvale; Bill C. Wong, Milpitas, both of Calif.

[73] Assignee: National Semiconductor Corporation, Santa Clara, Calif.

[21] Appl. No.: 933,233

[22] Filed: Sep. 18, 1997

[51] Int. Cl.$^6$ ............................................... H03M 1/66
[52] U.S. Cl. ................................. 341/150; 341/144
[58] Field of Search ................................. 341/172, 144, 341/145, 150, 153

[56] References Cited

U.S. PATENT DOCUMENTS 5,426,431   6/1995   Ryu .................................. 341/158

OTHER PUBLICATIONS

J.L. McCreary and P. R. Gray, "All–MOS Charge Redistribution Analog–to–Digital Conversion Techniques–Part 1," IEEE Journal of Solid–State Circuits, vol. SC–10, No. 6, Dec. 1975, pp. 371–379.

J. D. Everard, "A Single–Channel PCM Codec," IEEE Journal of Solid–State Circuits, vol. SC–14, No. 1, Feb. 1979, pp. 25–37.

K.B. Ohri and M.J. Callahan, Jr., "Integrated PCM Codec," IEEE Journal of Solid–State Circuits, vol. SC–14, No. 1, Feb. 1979, pp. 38–46.

*Primary Examiner*—Brian Young
*Assistant Examiner*—Peguy Jean Pierre
*Attorney, Agent, or Firm*—Limbach & Limbach L.L.P.

[57] ABSTRACT

A capacitor array-based, successive approximation analog-to-digital signal converter includes a capacitor array with a central coupling capacitor having a unit-value capacitance and two sets of input coupling capacitors having capacitances which are binary weighted multiples of such unit-value capacitance. During the sampling phase, the first set of input coupling capacitors is grounded while the second set of input coupling capacitors is driven by the analog input voltage. During the holding, or conversion, phase, one of the input coupling capacitors in the second set is grounded while each one of the input coupling capacitors in the first set and each one of the remaining input coupling capacitors in the second set is driven by a respective binary multiple of a fixed reference voltage, with each one of such binary multiples corresponding to one of the bits of the successive approximation result.

12 Claims, 5 Drawing Sheets

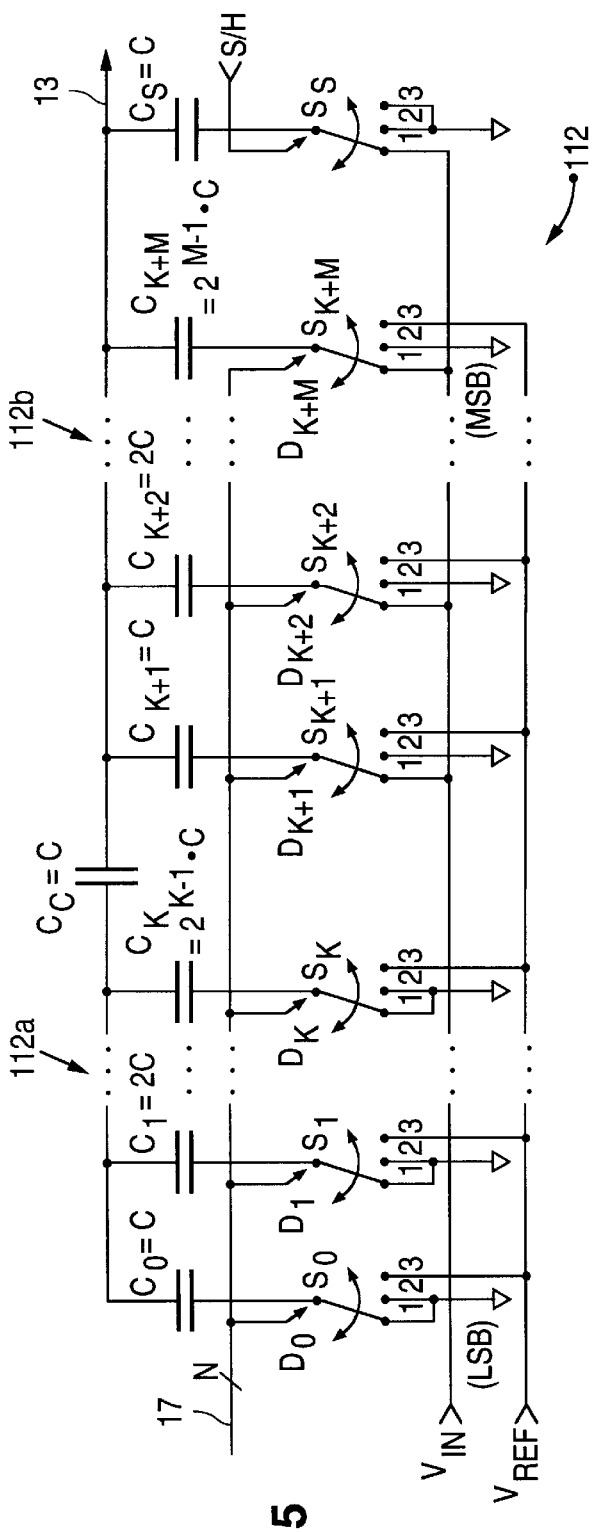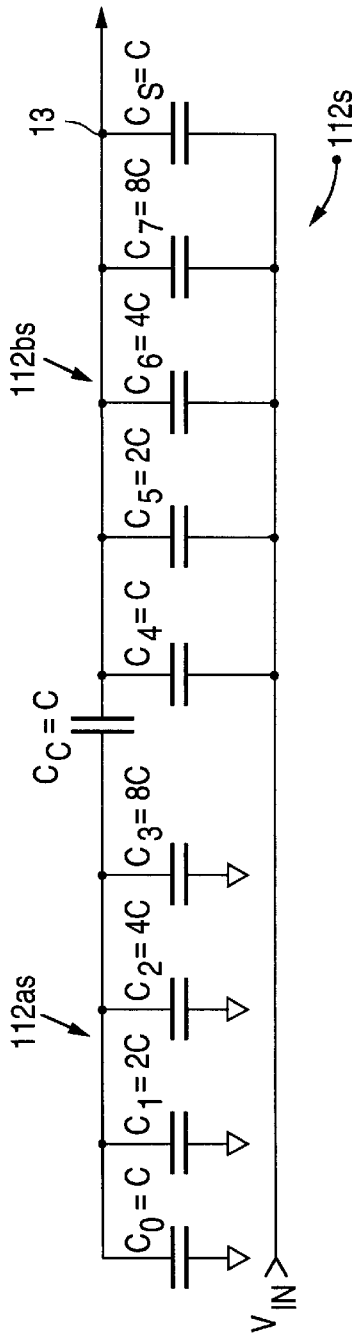
FIGURE 5
FIGURE 5A

5,889,486

SPLIT CAPACITOR ARRAY FOR DIGITAL-TO-ANALOG SIGNAL CONVERSION

BACKGROUND OF THE INVENTION

1. Field of the Invention

The present invention relates to successive approximation analog-to-digital signal converters (SAR ADCs), and in particular, to capacitor arrays forming the digital-to-analog converter (DAC) portion of an SAR ADC.

2. Description of the Related Art

Referring to FIG. 1, a conventional SAR ADC implemented with an array of capacitors for the DAC portion includes a DAC 12, voltage comparator 14, and SAR logic 16, interconnected as shown. The analog input $V_{IN}$ is processed, i.e., weighted, within the DAC 12 in accordance with the digital data bits 17 from the SAR logic 16. This produces an analog voltage at output 13 which is compared to a reference voltage $V_{CR}$ by the comparator 14. The comparator output 15 is processed by the SAR logic 16 in accordance with well known principles to produce the digital output data bits 17.

Using a capacitor array-based DAC, as opposed to a resistive ladder network (the analog output of which is compared against the analog input $V_{IN}$ by the comparator), provides several advantages, such as no DC power dissipation, no static current drain through switches, plus good matching between the passive components, i.e., the capacitors.

Referring to FIG. 2, a conventional implementation of the capacitor array 12a within the DAC 12 uses binary weighted capacitor values. During the sampling phase, each of the capacitors $C_0, C_1, C_2, \ldots, C_{N-1}$ within the array is driven by the analog input $V_{IN}$, while during the hold phase, i.e., the successive approximation conversion phase, each capacitor is individually driven by a reference voltage $V_{REF}$ which is weighted with one of the input data bits $D_K$.

Referring to FIG. 3, operation of the conventional binary capacitor array can be better understood. In addition to the capacitor array 12a itself, the DAC 12 also includes a switching matrix 12b which includes N switches $S_0, S_1, S_2 \ldots, S_{N-1}$ (where N equals the number of digital data bits 17) and controls the driving of the individual capacitors $C_0, C_1, C_2, \ldots, C_{N-1}$. During the sampling phase, the switch S across the inputs of the comparator 14, in accordance with a sample and hold control signal S/H, is closed and the input switches $S_0$–$S_{N-1}$ are in position 1, thereby causing the capacitors to be driven by the analog input $V_{IN}$. During the hold phase, the switch S across the inputs of the comparator 14, in accordance with the control signal S/H, is opened and each of the individual input switches $S_0$–$S_{N-1}$, in accordance with its respective digital data signal bit $D_0$–$D_{N-1}$, is switched into position 2 or 3. For example, for the first input switch $S_0$, if its data bit $D_0$ is a logic 0, the switch $S_0$ is in position 2, while if the data bit $D_0$ is a logic 1, the switch $S_0$ is in position 3. Accordingly, the inputs to each of the capacitors $C_0$–$C_{N-1}$ is a binary weighted version of the reference voltage $V_{REF}$.

Notwithstanding the aforementioned advantages of a capacitor array-based DAC, however, such an implementation has a significant disadvantage. In order to provide good matching of the capacitors, the larger capacitors are constructed using multiples of a selected unit capacitance. However, for the implementation as shown in FIGS. 2 and 3, the ratio of the larger capacitor to the smallest capacitor increases exponentially with the number of bits. This increases the area needed for the capacitor array, as well as the input capacitance during the sampling phase of operation. For example, the input capacitance for such implementation during the sampling phase is the sum of the capacitances of all of the input capacitors $C_0$–$C_{N-1}$ (i.e., $C + 2C + 4C + \ldots + 2^{N-1} \cdot C$).

Referring to FIG. 4, one conventional technique used to reduce the necessary area for the capacitor array, as well as reduce the large input capacitance during the sampling phase, is to use a split capacitor array. In such a DAC 12c which uses such an array, a coupling capacitor $C_C$ essentially splits the array into two smaller capacitor arrays. Operation of the primary input switches $S_0$–$S_{K+M}$ for driving the primary input capacitors $C_0$–$C_{K+M}$ (where K+M=N) is as described above in connection with the DAC 12b of FIG. 3. One additional input capacitor $C_S$, driven by the sample and hold control signal S/H, is also used, along with a corresponding switch $S_S$ which is switched into position 1 during the sampling phase and is switched into position 2 during the hold phase. The areas of the necessary capacitors are reduced because of the reduced maximum capacitor value within each of the smaller capacitor arrays on either side of the coupling capacitor $C_C$.

However, a significant disadvantage of this technique is the fractional value of the coupling capacitor $C_C$ used to split the overall capacitor array. Having such a fractional value results in poor matching between the coupling capacitor $C_C$ and the remaining individual capacitors $C_S$, $C_0$–$C_K$, $C_{K+1}$–$C_{K+M}$ within the array. While it is possible to improve this matching by appropriately ratioing the area and perimeter of the coupling capacitor $C_C$ to the area and perimeter of the unit capacitors $C_S$, $C_0$–$C_K$, $C_{K+1}$–$C_{K+M}$, this makes the layout of the array more difficult to achieve. Further, any mismatch between the fractional coupling capacitor $C_C$ and the remaining capacitors $C_S$, $C_0$–$C_K$, $C_{K+1}$–$C_{K+M}$ affects the overall performance of the converter 12c in terms of its differential non-linearity.

Accordingly, it would be desirable to have an implementation of a capacitor array-based DAC which avoids problems associated with capacitors which increase exponentially in size with the number of bits, while also avoiding problems associated with matching between unit and fractional value capacitors.

SUMMARY OF THE INVENTION

A split capacitor array for use in performing digital-to-analog signal conversion in accordance with the present invention uses capacitors having capacitance values which are integer multiples of a unit capacitance value without requiring any capacitors having fractional values of such unit capacitance. Hence, the necessary sizes of the larger required capacitors are significantly reduced, no matching of fractional and unit value capacitances is required, and input capacitance during the sampling phase is significantly reduced. A split capacitor array for use in performing digital-to-analog signal conversion in accordance with another embodiment of the present invention further significantly reduces the input capacitance during the sampling phase as compared to conventional split capacitor arrays.

In accordance with one embodiment of the present invention, a split capacitor array for use in performing digital-to-analog signal conversion includes two connection nodes, two sets of input nodes, a coupling capacitor and two sets of input capacitors, individually and selectively receive a respective one of a first set of input voltages which includes a first set of digital input voltages. The second set of input nodes is configured to individually and selectively receive a respective one of a second set of input voltages which includes a second set of digital input voltages. The coupling capacitor is connected between the connection nodes. The first set of input capacitors is connected between the first connection node and the first set of input nodes. Each one of the first set of input capacitors is connected between the first connection node and a respective one of the first set of input nodes. The second set of input capacitors is connected between the second connection node and the second set of input nodes. Each one of the second set of input capacitors is connected between the second connection node and a respective one of the second set of input nodes. The first set of switch circuits is coupled to the first set of input nodes and is configured to receive the set of digital data signals and in accordance therewith provide: a first fixed reference voltage as each one of the first set of input voltages during a first time period; and a respective one of a portion of a set of binary multiples of a second fixed reference voltage as each respective one of the first set of input voltages during a second time period. The second set of switch circuits is coupled to the second set of input nodes and is configured to receive the set of digital data signals and in accordance therewith provide: the analog input voltage as each one of the second set of input voltages during the first time period; the first fixed reference voltage as each one of a portion of the second set of input voltages during the second time period; and a respective one of another portion of the set of binary multiples of the second fixed reference voltage as each respective one of another portion of the second set of input voltages during the second time period.

These and other features and advantages of the present invention will be understood upon consideration of the following detailed description of the invention and the accompanying drawings.

BRIEF DESCRIPTION OF THE DRAWING

FIG. 5 is a schematic representation of a split capacitor array-based digital-to-analog signal conversion circuit in accordance with one embodiment of the present invention.

FIGS. 5A and 5B are schematic representations of the split capacitor array of FIG. 5 when operated in sample and hold modes, respectively.

DETAILED DESCRIPTION OF THE INVENTION

Figure 1:
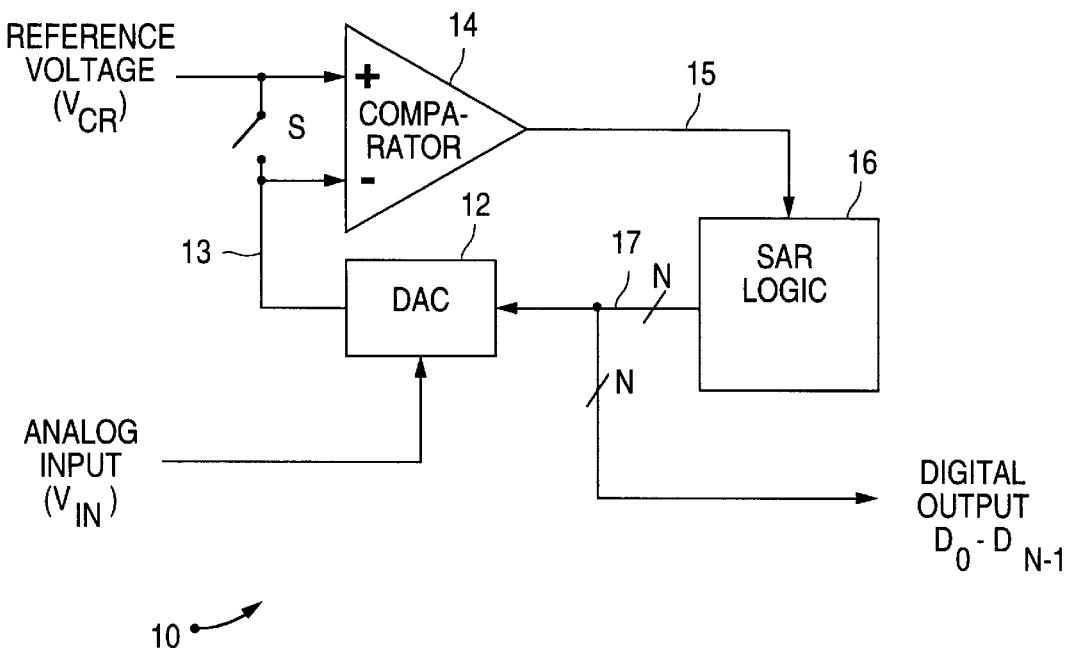
FIG. 1 is a functional block diagram of a conventional capacitor array-based successive approximation analog-to-digital converter.
Figure 2:
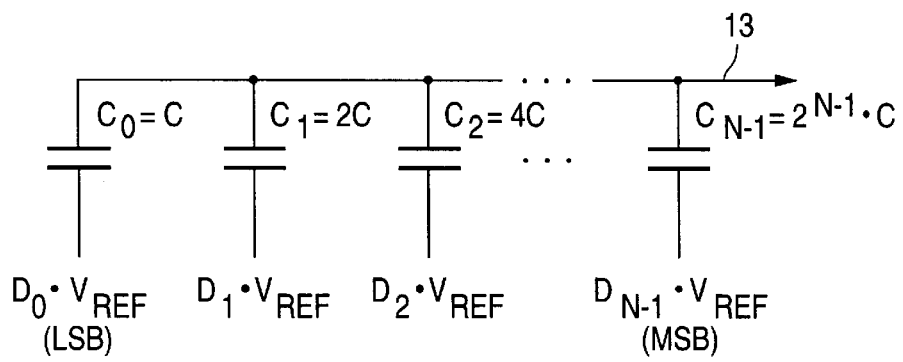
FIG. 2 is a schematic representation of a conventional capacitor array for the digital-to-analog converter of FIG. 1.
Figure 3:
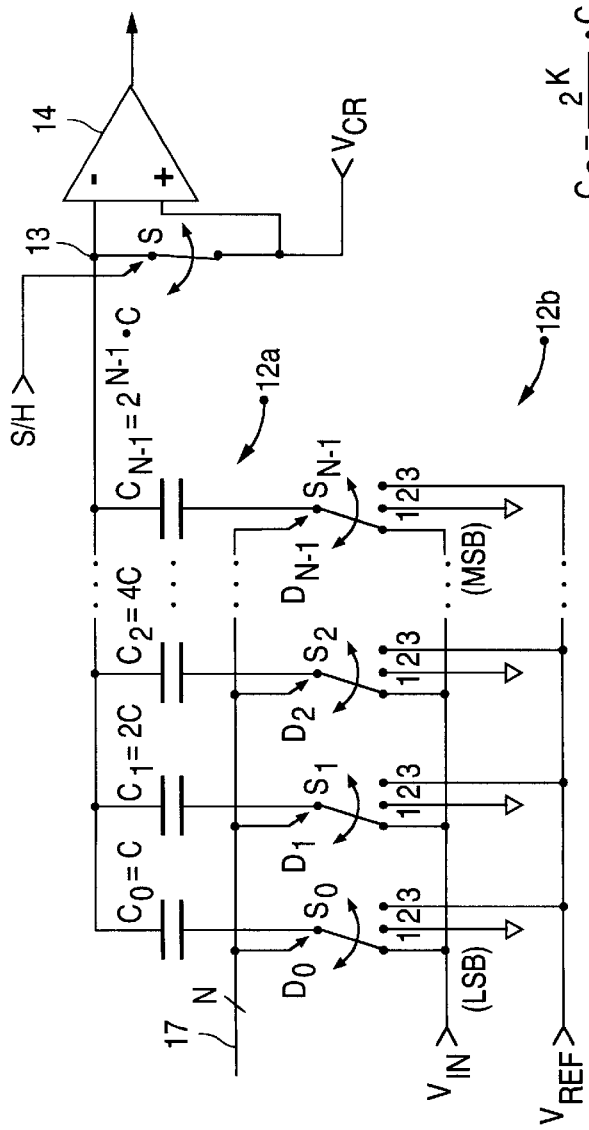
FIG. 3 is a schematic representation of the digital-to-analog converter of FIG. 1 using the capacitor array of FIG. 2.
Figure 4:
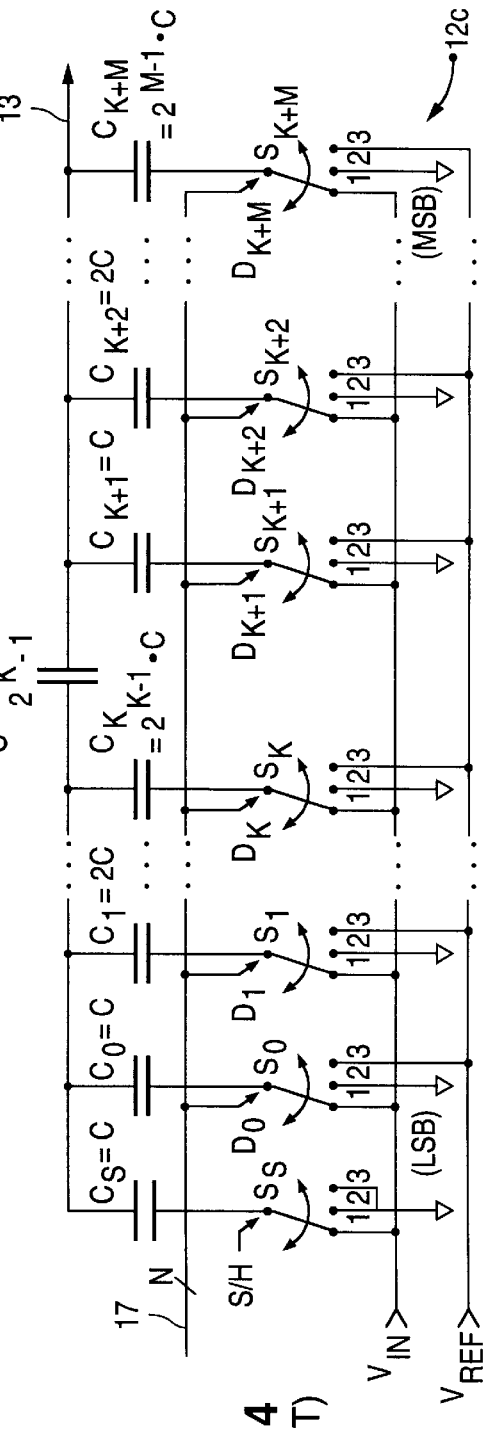
FIG. 4 is a schematic representation of a conventional split capacitor array-based digital-to-analog converter.

Referring to FIG. 5, a split capacitor array-based digital-to-analog signal conversion circuit 112 in accordance with one embodiment of the present invention has a number of advantages over conventional versions of such circuits, such as that represented in FIG. 4. The coupling capacitor $C_C$ has a unit value of capacitance C which divides the overall array into two small capacitor arrays 112a, 112b. One of the smaller capacitor arrays 112a has K capacitors while the other smaller array 112b has M+1 capacitors. The primary input switches $S_0$–$S_{K+M}$ are controlled by respective ones of the digital data bits $D_0$–$D_{K+M}$, while the auxiliary input switch $S_S$ is controlled by the sample and hold control signal S/H. These switches $S_0$–$S_{K+M}$, $S_S$ are controlled as follows: during the sample phase, all switches $S_0$–$S_{K+M}$, $S_S$ are in their switch position 1 states; and during the hold phase, the auxiliary switch $S_S$ is in its switch position 2 state, while the primary input switches $S_0$–$S_{K+M}$ are in their respective switch positions 2 or 3, depending upon whether the corresponding data bit $D_0$–$D_{K+M}$ is a logic 0 or logic 1, respectively. Hence: during the sample phase of operation, the capacitors $C_0$–$C_K$ of the first capacitor sub-array 112a are grounded, while the capacitors $C_{K+1}$–$C_{K+M}$, $C_S$ are driven by the analog input voltage $V_{IN}$; and during the hold phase, the auxiliary capacitor $C_S$ is grounded, while each of the remaining capacitors $C_0$–$C_K$, $C_{K+1}$–$C_{K+M}$ is driven by a binary weighted version of the reference voltage $V_{REF}$.

Figure 5B:
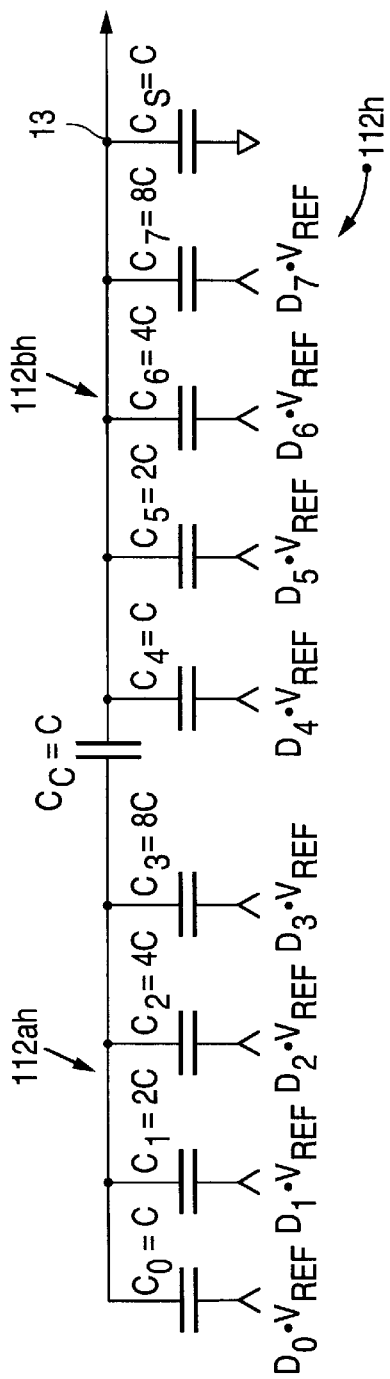

Referring to FIGS. 5A and 5B, the effects of these two modes of operation, i.e., sample and hold, on the connection of the various capacitors is represented for an 8-bit converter with a 4+4 split capacitor array. Accordingly, during the sample phase, the first four capacitors $C_0$–$C_3$ are grounded while the remaining capacitors $C_4$–$C_7$ and the auxiliary capacitor $C_S$ are driven by the analog input $V_{IN}$. During the hold, or conversion, phase, the auxiliary capacitor $C_S$ is grounded, while the remaining capacitors $C_0$–$C_7$ are connected to either circuit ground or the reference voltage $V_{REF}$ depending upon whether their respective data bits $D_0$–$D_7$ are a logic 0 or logic 1, respectively, in accordance with the successive approximation algorithm.

Referring again to FIG. 5, another advantage of such a split capacitor array-based digital-to-analog signal conversion circuit 112 is the significantly reduced input capacitance during the sample phase of operation. With this implementation 112, it can be shown that the total input capacitance during the sample phase can be expressed as follows:

$$C_{IN} = 2^M \cdot C \qquad (1)$$

This value of input capacitance $C_{IN}$ compares favorably (i.e., is almost half, if M=K) with the input capacitance for the conventional split capacitor array-based digital-to-analog converter 12c (FIG. 4) for which the input capacitance can be expressed as follows:

$$C_{IN} = 2^K \cdot C + (2^M - 1) \cdot C \qquad (2)$$

Generally, the total charge Q subtracted from the comparator input node 13 when the capacitor array 112 is switched from being driven by the analog input $V_{IN}$ to being grounded (at the beginning of the hold phase) is expressed as follows:

$$Q = 2^M \cdot C \cdot V_{IN} \qquad (3)$$

Figure 6:
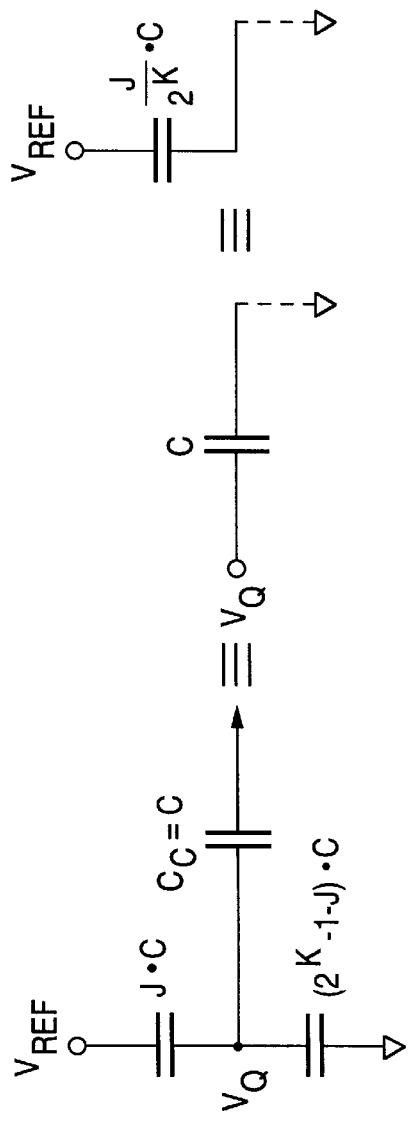
FIG. 6 represents equivalent circuits for computing the compensating charge injected by the least significant bit capacitors in the circuit of FIG. 5.

During the hold phase, this charge Q is compensated by the charge injected by the capacitors $C_0$–$C_{K+M}$, $C_S$ within the array 112. The first M most significant bits $D_{K+M}$–$D_{K+1}$ have a direct binary contribution. Since the comparator input node 13 returns to its initial value (the residue is minimized during the successive approximation conversion), it can be considered a virtual ground. Accordingly, the compensating charge injected by the least significant bit capacitors $C_K$–$C_0$ can be computed, using the equivalent circuits in FIG. 6, as follows:

$$V_Q = \frac{J \cdot V_{REF}}{(2^K - 1 - J) + J + 1} = \frac{J}{2^K} \cdot V_{REF} \quad (4)$$

$$Q = m \cdot C \cdot V_{REF} + \frac{J}{2^K} \cdot C \cdot V_{REF} \quad (5)$$

(where m is the binary value of the first M bits, i.e., the M most significant bits $D_{K+M}$–$D_{K+1}$, and J is the binary value of the last K bits, i.e., the K least significant bits $D_K$–$D_1$).

Combining Equations 3 and 5, the digital representation of the input voltage has the appropriate weights for the split and can be expressed as follows:

$$V_{IN} = \left( \frac{m}{2^M} + \frac{J}{2^M \cdot 2^K} \right) \cdot V_{REF} \quad (6)$$

Figure 7A:
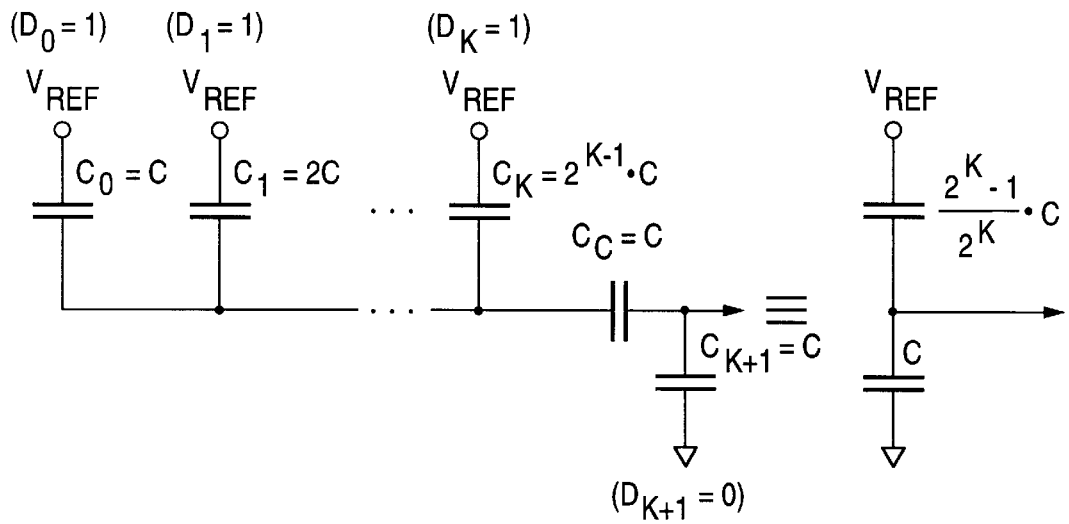
FIGS. 7A and 7B represent portions of an equivalent circuit for determining the differential linearity of the circuit of FIG. 5.
Figure 7B:
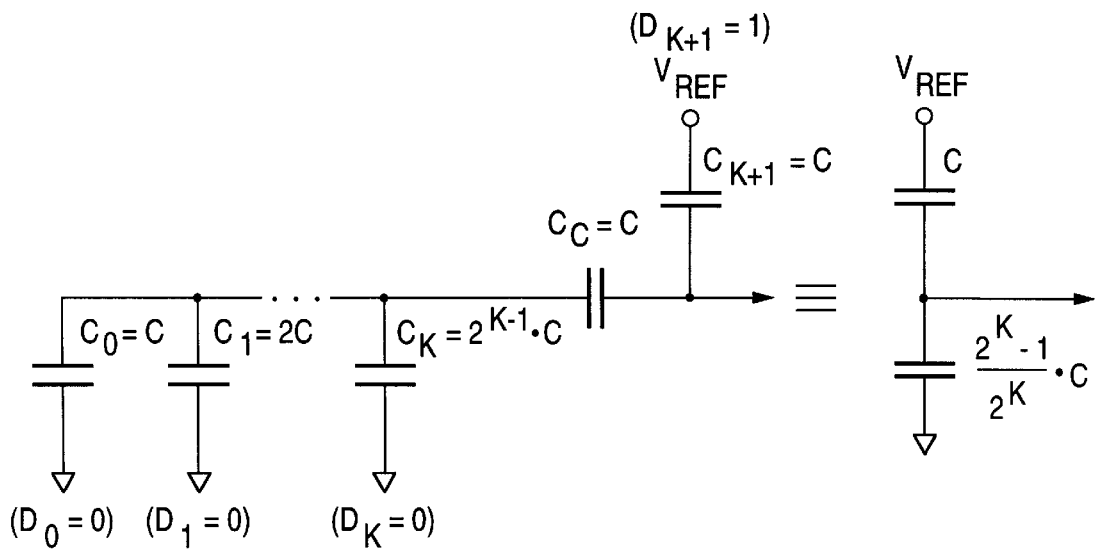

Referring to FIGS. 7A and 7B, an equivalent analysis can be performed to consider the differential linearity. The binary values of the least significant bit capacitors $C_K$–$C_0$ provide binary weighted contributions to the output voltage at the comparator input node 13, with the linearity being affected only by the capacitor matching. FIGS. 7A and 7B represent portions of the equivalent circuit at the K bit ($D_K$) transition. Using equivalent capacitances, it can be seen that the charge contribution from the digital data bits 17 pattern of $D_K D_{K-1} D_{K-2} \ldots D_0$ equals 011 . . . 1 is $(2^{K-1})/2^K$ of the charge contribution from the digital data bits 17 pattern of $D_K D_{K-1} D_{K-2} \ldots D_0$ equals 100 . . . 0. In others words, the difference between the contributions of the two codes is exactly 1 least significant bit. Therefore, the linearity at the transition points is quite good.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a split capacitor array for use in performing digital-to-analog signal conversion, comprising:
   a first connection node;
   a second connection node configured to provide an analog output voltage;
   a first plurality of input nodes configured to individually and selectively receive a respective one of a first plurality of input voltages which includes a first plurality of digital input voltages in a time-multiplexed manner;
   a second plurality of input nodes configured to individually and selectively receive a respective one of a second plurality of input voltages which includes a second plurality of digital input voltages in said time-multiplexed manner;
   a coupling capacitor connected between said first and second connection nodes and having a unit value of capacitance;
   a first plurality of input capacitors connected between said first connection node and said first plurality of input nodes, wherein each one of said first plurality of input capacitors has a capacitance which is a respective integer multiple of said unit value of capacitance and is connected between said first connection node and a respective one of said first plurality of input nodes; and
   a second plurality of input capacitors connected between said second connection node and said second plurality of input nodes, wherein each one of said second plurality of input capacitors has a capacitance which is a respective integer multiple of said unit value of capacitance and is connected between said second connection node and a respective one of said second plurality of input nodes.

2. The apparatus of claim 1, wherein each one of said respective integer multiples is binary weighted.

3. The apparatus of claim 1, further comprising:
   a first plurality of switch circuits coupled to said first plurality of input nodes and configured to receive a first plurality of switch control signals and in accordance therewith provide said first plurality of input voltages in said time-multiplexed manner; and
   a second plurality of switch circuits coupled to said second plurality of input nodes and configured to receive a second plurality of switch control signals and in accordance therewith provide said second plurality of input voltages in said time-multiplexed manner.

4. An apparatus including a split capacitor array for use in performing digital-to-analog signal conversion, comprising:
   a first connection node;
   a second connection node configured to provide an analog output voltage;
   a first plurality of input nodes configured to individually and selectively receive a respective one of a first plurality of input voltages which includes a first plurality of digital input voltages;
   a second plurality of input nodes configured to individually and selectively receive a respective one of a second plurality of input voltages which includes a second plurality of digital input voltages;
   a coupling capacitor connected between said first and second connection nodes;
   a first plurality of input capacitors connected between said first connection node and said first plurality of input nodes, wherein each one of said first plurality of input capacitors is connected between said first connection node and a respective one of said first plurality of input nodes; and
   a second plurality of input capacitors connected between said second connection node and said second plurality of input nodes, wherein each one of said second plurality of input capacitors is connected between said second connection node and a respective one of said second plurality of input nodes;
   wherein during a first time period
      each one of said first plurality of input nodes receives a first fixed reference voltage as each one of said first plurality of input voltages, and
      each one of said second plurality of input nodes receives an input signal voltage as each one of said second plurality of input voltages; and
   wherein during a second time period
      each one of a portion of said second plurality of input nodes receives said first fixed reference voltage as each one of a portion of said second plurality of input voltages,
      each one of said first plurality of input nodes receives a respective one of a portion of a plurality of binary multiples of a second fixed reference voltage as said respective one of said first plurality of input voltages, and each one of another portion of said second plurality of input nodes receives a respective one of another portion of said plurality of binary multiples of said second fixed reference voltage as said respective one of another portion of said second plurality of input voltages.

5. The apparatus of claim 4, further comprising:

a first plurality of switch circuits coupled to said first plurality of input nodes and configured to receive a first plurality of switch control signals and in accordance therewith provide said first plurality of input voltages during said first and second time periods; and a second plurality of switch circuits coupled to said second plurality of input nodes and configured to receive a second plurality of switch control signals and in accordance therewith provide said second plurality of input voltages during said first and second time periods.

6. An apparatus including a capacitor array-based, successive approximation analog-to-digital signal converter, comprising:

an analog voltage comparison circuit configured to receive and compare an analog input voltage and an analog feedback voltage and in accordance therewith provide a digital comparison result signal which indicates whether a value of said analog input voltage is greater than a corresponding value of said analog feedback voltage;

a successive approximation circuit, coupled to said analog voltage comparison circuit, configured to receive said digital comparison result signal and in accordance therewith provide a plurality of digital data signals which together represent an approximate binary value of said analog input voltage; and a digital-to-analog signal conversion circuit, coupled to said successive approximation circuit and said analog voltage comparison circuit, configured to receive and convert said plurality of digital data signals to said analog feedback voltage, wherein said digital-to-analog signal conversion circuit includes a first connection node, a second connection node configured to provide said analog feedback voltage, a first plurality of input nodes configured to individually and selectively receive a respective one of a first plurality of input voltages which includes a first plurality of digital input voltages in a time-multiplexed manner, a second plurality of input nodes configured to individually and selectively receive a respective one of a second plurality of input voltages which includes a second plurality of digital input voltages in said time-multiplexed manner, a coupling capacitor connected between said first and second connection nodes and having a unit value of capacitance, a first plurality of input capacitors connected between said first connection node and said first plurality of input nodes, wherein each one of said first plurality of input capacitors has a capacitance which is a respective integer multiple of said unit value of capacitance and is connected between said first connection node and a respective one of said first plurality of input nodes, a second plurality of input capacitors connected between said second connection node and said second plurality of input nodes, wherein each one of said second plurality of input capacitors has a capacitance which is a respective integer multiple of said unit value of capacitance and is connected between said second connection node and a respective one of said second plurality of input nodes, a first plurality of switch circuits, coupled to said first plurality of input nodes, configured to receive said plurality of digital data signals and in accordance therewith provide said first plurality of input voltages in said time-multiplexed manner, and a second plurality of switch circuits, coupled to said second plurality of input nodes, configured to receive said plurality of digital data signals and in accordance therewith provide said second plurality of input voltages in said time-multiplexed manner.

7. The apparatus of claim 6, wherein each one of said respective integer multiples is binary weighted.

8. An apparatus including a capacitor array-based, successive approximation analog-to-digital signal converter, comprising:

an analog voltage comparison circuit configured to receive and compare an analog input voltage and an analog feedback voltage and in accordance therewith provide a digital comparison result signal which indicates whether a value of said analog input voltage is greater than a corresponding value of said analog feedback voltage;

a successive approximation circuit, coupled to said analog voltage comparison circuit, configured to receive said digital comparison result signal and in accordance therewith provide a plurality of digital data signals which together represent an approximate binary value of said analog input voltage; and a digital-to-analog signal conversion circuit, coupled to said successive approximation circuit and said analog voltage comparison circuit, configured to receive and convert said plurality of digital data signals to said analog feedback voltage, wherein said digital-to-analog signal conversion circuit includes a first connection node, a second connection node configured to provide said analog feedback voltage, a first plurality of input nodes configured to individually and selectively receive a respective one of a first plurality of input voltages which includes a first plurality of digital input voltages, a second plurality of input nodes configured to individually and selectively receive a respective one of a second plurality of input voltages which includes a second plurality of digital input voltages, a coupling capacitor connected between said first and second connection nodes, a first plurality of input capacitors connected between said first connection node and said first plurality of input nodes, wherein each one of said first plurality of input capacitors is connected between said first connection node and a respective one of said first plurality of input nodes, a second plurality of input capacitors connected between said second connection node and said second plurality of input nodes, wherein each one of said second plurality of input capacitors is connected between said second connection node and a respective one of said second plurality of input nodes, a first plurality of switch circuits, coupled to said first plurality of input nodes, configured to receive said plurality of digital data signals and in accordance therewith provide
   a first fixed reference voltage as each one of said first plurality of input voltages during a first time period, and
   a respective one of a portion of a plurality of binary multiples of a second fixed reference voltage as each said respective one of said first plurality of input voltages during a second time period, and
a second plurality of switch circuits, coupled to said second plurality of input nodes, configured to receive said plurality of digital data signals and in accordance therewith provide
   said analog input voltage as each one of said second plurality of input voltages during said first time period,
   said first fixed reference voltage as each one of a portion of said second plurality of input voltages during said second time period, and
   a respective one of another portion of said plurality of binary multiples of said second fixed reference voltage as each said respective one of another portion of said second plurality of input voltages during said second time period.

9. A method of digital-to-analog signal conversion, said method comprising the steps of:
   coupling first and second connection nodes via a coupling capacitor having a unit value of capacitance;
   coupling said first connection node and a first plurality of input nodes via a first plurality of input capacitors, wherein each one of said first plurality of input capacitors has a capacitance which is a respective integer multiple of said unit value of capacitance and is connected between said first connection node and a respective one of said first plurality of input nodes;
   coupling said second connection node and a second plurality of input nodes via a second plurality of input capacitors, wherein each one of said second plurality of input capacitors has a capacitance which is a respective integer multiple of said unit value of capacitance and is connected between said second connection node and a respective one of said second plurality of input nodes;
   individually and selectively inputting respective ones of a first plurality of input voltages which includes a first plurality of digital input voltages in a time-multiplexed manner to said first plurality of input nodes;
   individually and selectively inputting respective ones of a second plurality of input voltages which includes a second plurality of digital input voltages in said time-multiplexed manner to said second plurality of input nodes; and
   outputting an analog voltage via said second connection node.

10. A method of digital-to-analog signal conversion, said method comprising the steps of:
   coupling first and second connection nodes via a coupling capacitor;
   coupling said first connection node and a first plurality of input nodes via a first plurality of input capacitors, wherein each one of said first plurality of input capacitors is connected between said first connection node and a respective one of said first plurality of input nodes;
   coupling said second connection node and a second plurality of input nodes via a second plurality of input capacitors, wherein each one of said second plurality of input capacitors is connected between said second connection node and a respective one of said second plurality of input nodes;
   individually and selectively inputting respective ones of a first plurality of input voltages which includes a first plurality of digital input voltages to said first plurality of input nodes such that
      during a first time period each one of said first plurality of input nodes receives a first fixed reference voltage as each one of said first plurality of input voltages, and
      during a second time period each one of said first plurality of input nodes receives a respective one of a portion of a plurality of binary multiples of a second fixed reference voltage as said respective one of said first plurality of input voltages; and
   individually and selectively inputting respective ones of a second plurality of input voltages which includes a second plurality of digital input voltages to said second plurality of input nodes such that
      during a first time period each one of said second plurality of input nodes receives an input signal voltage as each one of said second plurality of input voltages, and
      during a second time period
         each one of a portion of said second plurality of input nodes receives said first fixed reference voltage as each one of a portion of said second plurality of input voltages, and
         each one of another portion of said second plurality of input nodes receives a respective one of another portion of said plurality of binary multiples of said second fixed reference voltage as said respective one of another portion of said second plurality of input voltages;
   outputting an analog voltage via said second connection node.

11. A method of analog-to-digital signal conversion using successive approximation, said method comprising the steps of:
   receiving and comparing an analog input voltage and an analog feedback voltage and in accordance therewith generating a digital comparison result signal which indicates whether a value of said analog input voltage is greater than a corresponding value of said analog feedback voltage;
   performing a successive approximation operation upon said digital comparison result signal and in accordance therewith generating a plurality of digital data signals which together represent an approximate binary value of said analog input voltage; and
   converting said plurality of digital data signals to said analog feedback voltage by performing the steps of
      coupling first and second connection nodes via a coupling capacitor having a unit value of capacitance,
      coupling said first connection node and a first plurality of input nodes via a first plurality of input capacitors, wherein each one of said first plurality of input capacitors has a capacitance which is a respective integer multiple of said unit value of capacitance and is connected between said first connection node and a respective one of said first plurality of input nodes,
      coupling said second connection node and a second plurality of input nodes via a second plurality of input capacitors, wherein each one of said second plurality of input capacitors has a capacitance which is a respective integer multiple of said unit value of capacitance and is connected between said second connection node and a respective one of said second plurality of input nodes, receiving said plurality of digital data signals and in accordance therewith individually and selectively inputting respective ones of a first plurality of input voltages which includes a first plurality of digital input voltages in a time-multiplexed manner to said first plurality of input nodes, receiving said plurality of digital data signals and in accordance therewith individually and selectively inputting respective ones of a second plurality of input voltages which includes a second plurality of digital input voltages in said time-multiplexed manner to said second plurality of input nodes, and outputting said analog feedback voltage via said second connection node.

12. A method of analog-to-digital signal conversion using successive approximation, said method comprising the steps of:

receiving and comparing an analog input voltage and an analog feedback voltage and in accordance therewith generating a digital comparison result signal which indicates whether a value of said analog input voltage is greater than a corresponding value of said analog feedback voltage;

performing a successive approximation operation upon said digital comparison result signal and in accordance therewith generating a plurality of digital data signals which together represent an approximate binary value of said analog input voltage; and converting said plurality of digital data signals to said analog feedback voltage by performing the steps of coupling first and second connection nodes via a coupling capacitor, coupling said first connection node and a first plurality of input nodes via a first plurality of input capacitors, wherein each one of said first plurality of input capacitors is connected between said first connection node and a respective one of said first plurality of input nodes, coupling said second connection node and a second plurality of input nodes via a second plurality of input capacitors, wherein each one of said second plurality of input capacitors is connected between said second connection node and a respective one of said second plurality of input nodes, receiving said plurality of digital data signals and in accordance therewith individually and selectively inputting respective ones of a first plurality of input voltages which includes a first plurality of digital input voltages to said first plurality of input nodes such that during a first time period each one of said first plurality of input nodes receives a first fixed reference voltage as each one of said first plurality of input voltages, and during a second time period each one of said first plurality of input nodes receives a respective one of a portion of a plurality of binary multiples of a second fixed reference voltage as said respective one of said first plurality of input voltages, receiving said plurality of digital data signals and in accordance therewith individually and selectively inputting respective ones of a second plurality of input voltages which includes a second plurality of digital input voltages to said second plurality of input nodes such that during a first time period each one of said second plurality of input nodes receives an input signal voltage as each one of said second plurality of input voltages, during a second time period each one of a portion of said second plurality of input nodes receives said first fixed reference voltage as each one of a portion of said second plurality of input voltages, and each one of another portion of said second plurality of input nodes receives a respective one of another portion of said plurality of binary multiples of said second fixed reference voltage as said respective one of another portion of said second plurality of input voltages, and outputting said analog feedback voltage via said second connection node.

* * * * *